(12) United States Patent
Tamura et al.

(10) Patent No.: US 9,563,552 B2
(45) Date of Patent: Feb. 7, 2017

(54) STORAGE CONTROL DEVICE AND STORAGE CONTROL METHOD

(71) Applicant: FUJITSU LIMITED, Kawasaki-shi, Kanagawa (JP)

(72) Inventors: Yuma Tamura, Kawasaki (JP); Hironori Saito, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 77 days.

(21) Appl. No.: 14/669,391

(22) Filed: Mar. 26, 2015

(65) Prior Publication Data

US 2015/0380110 A1 Dec. 31, 2015

(30) Foreign Application Priority Data

Jun. 30, 2014 (JP) ................................ 2014-134436

(51) Int. Cl.
| | |
|---|---|
| *G06F 12/00* | (2006.01) |
| *G06F 12/02* | (2006.01) |
| *G06F 11/10* | (2006.01) |
| *G11C 16/34* | (2006.01) |
| *G11C 29/44* | (2006.01) |
| *G11C 29/00* | (2006.01) |

(Continued)

(52) U.S. Cl.
CPC ....... *G06F 12/0246* (2013.01); *G06F 11/1076* (2013.01); *G11C 16/349* (2013.01); *G11C 29/44* (2013.01); *G11C 29/82* (2013.01); *G06F 2212/1032* (2013.01); *G06F 2212/7205* (2013.01); *G06F 2212/7208* (2013.01); *G06F 2212/7211* (2013.01); *G11C 16/20* (2013.01); *G11C 2029/0409* (2013.01); *G11C 2029/4402* (2013.01); *G11C 2029/5004* (2013.01)

(58) Field of Classification Search
CPC .................... G06F 12/0246; G06F 2212/1032; G06F 2212/7208; G06F 2212/7211; G06F 2212/7205; G11C 29/44; G11C 16/349; G11C 2029/4402
See application file for complete search history.

(56) References Cited

U.S. PATENT DOCUMENTS

| | | | |
|---|---|---|---|
| 2003/0002366 A1 * | 1/2003 | Mizoguchi | ............ G06F 3/0619 |
| | | | 365/201 |
| 2007/0233931 A1 | 10/2007 | Tanaka et al. | |

(Continued)

FOREIGN PATENT DOCUMENTS

| | | |
|---|---|---|
| JP | 2007-265265 | 10/2007 |
| JP | 2011-150590 | 8/2011 |

*Primary Examiner* — Mark Giardino, Jr.
(74) *Attorney, Agent, or Firm* — Staas & Halsey LLP

(57) ABSTRACT

A storage control device that controls a solid state drive group including two or more solid state drives sharing data storage includes a detector that detects a wear state of each of the solid state drives, a separation controller that separates a solid state drive having a wear value, which represents a wear state, exceeding a first threshold among the solid state drives, and an enlargement controller that, when detecting a solid state drive having a wear value, which represents a wear state, exceeding a second threshold less than the first threshold among the solid state drives in the solid state drive group, enlarges a difference in a wear value, which represents a wear state, between the solid state drive having the wear value exceeding the second threshold and a remainder of the solid state drives.

7 Claims, 16 Drawing Sheets

(51) Int. Cl.
    *G06F 13/00*     (2006.01)
    *G06F 13/28*     (2006.01)
    *G11C 29/50*     (2006.01)
    *G11C 16/20*     (2006.01)
    *G11C 29/04*     (2006.01)

(56) References Cited

U.S. PATENT DOCUMENTS

| | | | |
|---|---|---|---|
| 2009/0046512 A1* | 2/2009 | Halloush | G11C 16/22 365/185.09 |
| 2010/0005228 A1* | 1/2010 | Fukutomi | G06F 11/108 711/103 |
| 2011/0141833 A1* | 6/2011 | Haines | G11C 11/5628 365/189.16 |

* cited by examiner

STORAGE CONTROL DEVICE AND STORAGE CONTROL METHOD

CROSS-REFERENCE TO RELATED APPLICATION

This application is based upon and claims the benefit of priority of the prior Japanese Patent Application No. 2014-134436, filed on Jun. 30, 2014, the entire contents of which are incorporated herein by reference.

FIELD

The embodiments discussed herein are related to a storage control device and a storage control method.

BACKGROUND

Data centers have to deal with large amounts of data while ensuring reliability, and typically employ redundant arrays of inexpensive disks (RAID) technology using multiple hard disk drives (HDDs) as storage devices (RAID devices). Some storage devices use solid state drives (SSDs), which are faster than HDDs. In SSDs, storage elements deteriorate because of writing and erasing of data. From the viewpoint of ensuring reliability, lifetime management such as load leveling is employed.

Examples of the related art are disclosed in Japanese Laid-open Patent Publication No. 2007-265265 and Japanese Laid-open Patent Publication No. 2011-150590.

However, RAID (a solid state drive group) including two or more SSDs has a possibility that multiple dead will occur. The multiple dead represents a state in which a plurality of SSDs reach their end of life at that same time. In particular, when leveling of the load on SSDs is performed, the risk of multiple dead occurring is higher in the solid state drive group.

SUMMARY

According to an aspect of the invention, a storage control device that controls a solid state drive group including two or more solid state drives sharing data storage includes a detector that detects a wear state of each of the solid state drives, a separation controller that separates a solid state drive having a wear value, which represents a wear state, exceeding a first threshold among the solid state drives, and an enlargement controller that, when detecting a solid state drive having a wear value, which represents a wear state, exceeding a second threshold less than the first threshold among the solid state drives in the solid state drive group, enlarges a difference in a wear value, which represents a wear state, between the solid state drive having the wear value exceeding the second threshold and a remainder of the solid state drives.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments will be described in detail with reference to the accompanying drawings.

First Embodiment

Figure 1:
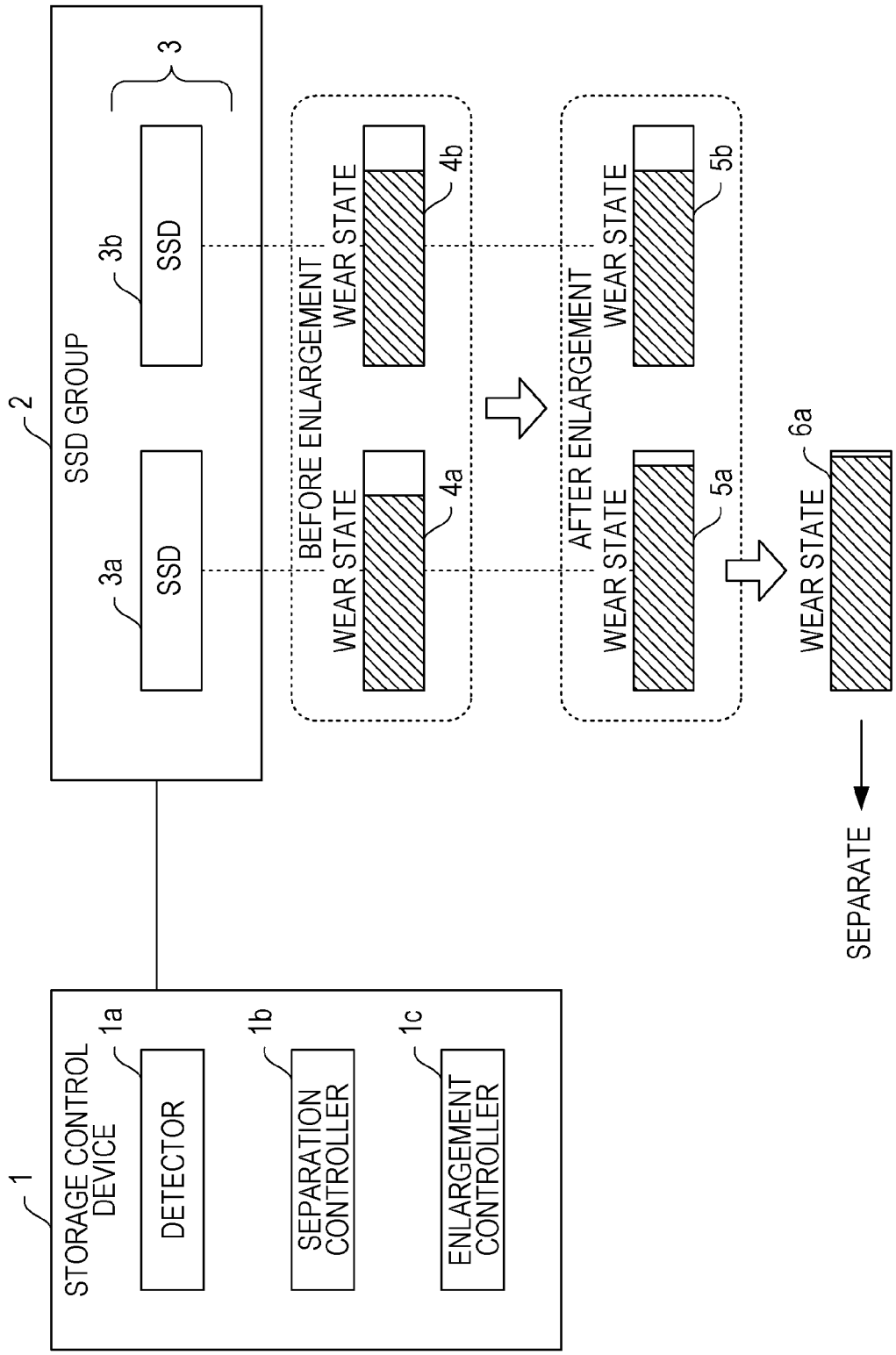
FIG. 1 is a diagram illustrating an example of a configuration of a storage control device of a first embodiment.

First, a storage control device of a first embodiment will be described using FIG. 1. FIG. 1 is a diagram illustrating an example of a configuration of the storage control device of the first embodiment.

A storage control device 1 controls a solid state drive (SSD) group 2. The SSD group 2 includes two or more SSDs 3 that share data storage, for example, SSDs 3a and 3b. For example, two or more SSDs 3 share data storage using the RAID technology. Note that data storage shared by two or more SSDs 3 enables implementation of protection and availability of data by using two or more SSDs 3, and includes the case where two or more SSDs 3 store duplicate data, as well as the case where each of the SSDs 3 stores different data. For simplicity of description, the SSD group 2 is assumed to include two SSDs 3a and 3b. However, the SSD group 2 may include three or more SSDs 3.

In the SSD 3, the wear state is changed by rewriting operations during use. The wear state is denoted by information indicating how close the SSD 3 is to failure. For example, the wear state may be represented by a value, a percentage, or the like that changes toward a threshold over which the SSD 3 is unusable. The wear state can be represented by a numerical value (wear value) that can be compared with a given threshold.

The storage control device 1 includes a detector 1a, a separation controller 1b, and an enlargement controller 1c. The detector is detects the wear state of every SSD 3. That is, the detector is detects the wear state of the SSD 3a and the wear state of the SSD 3b. Note that the wear state detected by the detector is may be equivalent to the wear value, or may be numerically expressed as a wear value obtained using a given transformation or transformation rule. Such a wear value is capable of representing a wear state of the SSD 3.

The separation controller 1b separates the SSD 3 whose wear value, which represents the wear state, exceeds a first threshold. For example, in the case where a wear state 6a of the SSD 3a exceeds the first threshold, the separation controller 1b separates the SSD 3a. For example, the separation controller 1b may separate the SSD 3a by moving information stored in the SSD 3a to another SSD that is not illustrated. The first threshold is a threshold acting as a trigger for separation of the SSD 3. For example, the first threshold is a value acting as a trigger for a failure prediction warning issued by a self-diagnosis function of the SSD 3.

When the SSD 3 having a wear value that exceeds a second threshold less than the first threshold is present in the SSD group 2, the enlargement controller is enlarges the difference between the wear value of the SSD 3 exceeding the second threshold and the wear value of another SSD 3. The second threshold is a threshold that triggers warnings of multiple dead occurring. The multiple dead represents a state in which a plurality of SSDs reach their end of life at that same time.

For example, when either or both of a wear value representing a wear state 4a of the SSD 3a and a wear value representing a wear state 4b of the SSD 3b exceed the second threshold, the enlargement controller is enlarges the difference between the wear value of the SSD 3a and the wear value of the SSD 3b. Note that the size of a cross-hatched portion indicating a wear state illustrated in FIG. 1 represents the size of a wear value representing the wear state.

The enlargement controller is may enlarge the difference between the wear value of the SSD 3a and the wear value of the SSD 3b by performing a rewriting operation on the SSD 3a. The enlargement controller is may perform a rewriting operation on the SSD 3a, for example, by causing the SSD 3a to perform garbage collection. As a result, the wear state 4a of the SSD 3a changes to a wear state 5a, and the wear state 4b of the SSD 3b changes to a wear state 5b. The difference between the wear value representing the wear state 5a of the SSD 3a and the wear value representing the wear state 5b of the SSD 3b is enlarged.

Thus, the storage control device 1 may reduce the risk of multiple dead occurring in which the SSD 3a and the SSD 3b reach their end of life at the same time. In such a manner, the storage control device 1 can be expected to reach a wear state 6a in which the SSD 3a reaches the first threshold earlier than the SSD 3b reaches the first threshold. That is, the storage control device 1 may safely separate one of two or more SSDs 3 that share data storage.

Note that, in the case where the SSD 3a and the SSD 3b share data storage using RAID, the storage control device 1 may reduce data loss due to multiple dead from occurring. In this way, the storage control device 1 may provide protection and availability of data in RAID in which two or more SSDs 3 share data storage.

Second Embodiment

Figure 2:
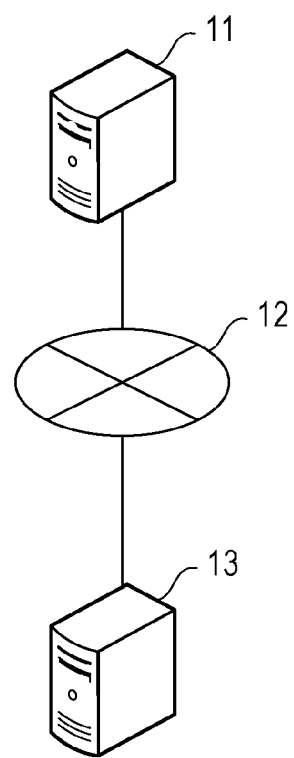
FIG. 2 is a diagram illustrating an example of a configuration of a storage system of a second embodiment.

Next, a storage system of a second embodiment will be described using FIG. 2. FIG. 2 is a diagram illustrating an example of a configuration of the storage system of the second embodiment.

A storage system 10 includes a host 11 and a RAID device 13 connected to the host 11 via a network 12. The storage system 10 writes data to the RAID device 13 or reads data from the RAID device 13 in response to an input/output (I/O) request transmitted by the host 11.

Figure 3:
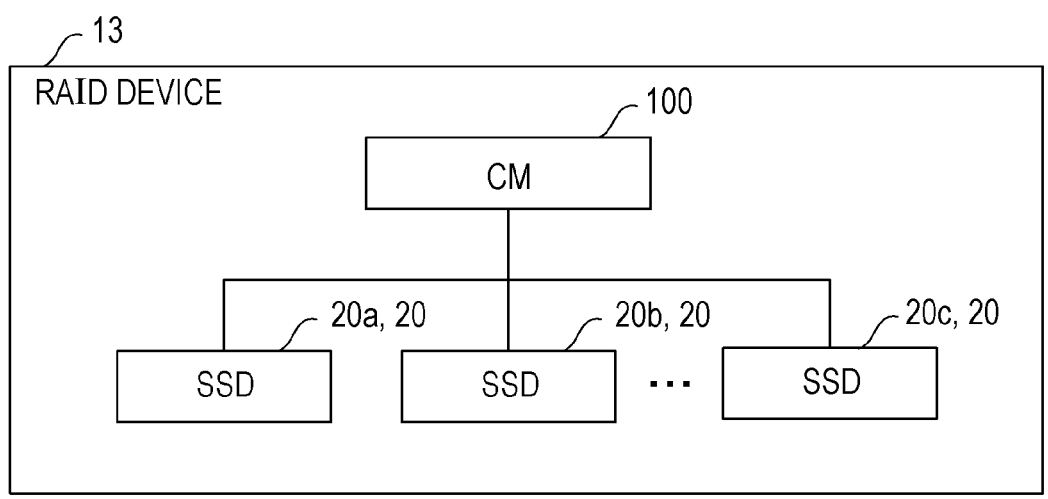
FIG. 3 is a diagram illustrating an example of a configuration of a RAID device of the second embodiment.

Next, the configuration of the RAID device 13 of the second embodiment will be described using FIG. 3. FIG. 3 is a diagram illustrating an example of a configuration of a RAID device of the second embodiment.

The RAID device 13 includes a controller module (CM) 100 and a plurality of SSDs 20 (20a, 20b, . . . , 20c). The RAID device 13 implements RAID technology using a plurality of SSDs 20. For example, the RAID device 13 implements RAID 1 by using an SSD 20a as the master and using an SSD 20b as the slave.

The plurality of SSDs form one of the storage devices. The CM 100 is a controller module of the RAID device 13. The CM 100 accepts a host I/O (an I/O request from the host 11) from the host 11 and controls the SSDs 20. Consequently, the CM 100 of the RAID device 13 corresponds to a storage control device to control storage devices. Note that the RAID device 13 may contain the SSDs 20 or may be externally connected to the SSDs 20.

Figure 4:
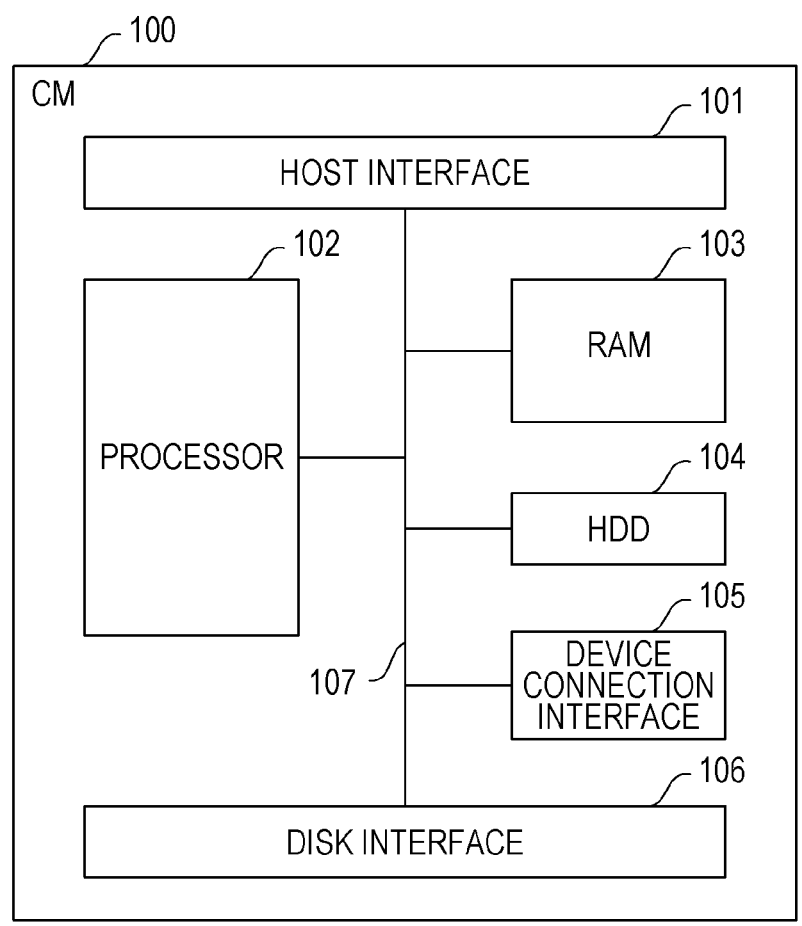
FIG. 4 is a diagram illustrating an example of a hardware configuration of a CM of the second embodiment.

Next, a hardware configuration of the CM 100 of the second embodiment will be described using FIG. 4. FIG. 4 is a diagram illustrating an example of a hardware configuration of a CM of the second embodiment.

The CM 100 includes a host interface 101, a processor 102, a random access memory (RAM) 103, an HDD 104, a device connection interface 105, a disk interface 106, and a bus 107.

The entire CM 100 is controlled by the processor 102. The RAM 103 and a plurality of peripheral devices are connected to the processor 102 via the bus 107. The processor 102 may be a multi-core processor including two or more processors.

The processor 102 is, for example, a central processing unit (CPU), a micro-processing unit (MPU), a digital signal processor (DSP), an application specific integrated circuit (ASIC), or a programmable logic device (PLD).

The RAM 103 is used as a main storage device of the CM 100. At least some of the programs of an operating system (OS) and the application programs caused to be run by the processor 102 are temporarily stored in the RAM 103. Various types of data used for processing performed by the processor 102 are also stored in the RAM 103. The RAM 103 also functions as a cache memory of the processor 102.

The peripheral devices connected to the bus 107 include the host interface 101, the HDD 104, the device connection interface 105, and the disk interface 106.

The host interface 101 transmits and receives data to and from the host 11 over the network 12. The host interface 101 is, for example, a channel adapter.

The HDD 104 magnetically writes and reads data to and from a disk incorporated therein. The HDD 104 is used as an auxiliary storage device of the CM 100. Programs of an OS, application programs, and various kinds of data are stored on the HDD 104. Note that a semiconductor storage device such as a flash memory may be used as an auxiliary storage device.

The device connection interface 105 is a communication interface for connecting peripheral devices to the CM 100. A memory device and a memory reader/writer, which are not illustrated in the drawing, may be connected to the device connection interface 105. The memory device is a recording medium including a function of communication with the device connection interface 105. The memory reader/writer is a device that writes data to a memory card or reads data from a memory card. The memory card is, for example, a card-type recording medium.

A monitor, which is not illustrated in the drawing, may also be connected to the device connection interface 105. In this case, the device connection interface 105 has a graphic processing function for causing an image to be displayed on the screen of the monitor according to an instruction from the processor 102.

A keyboard and a mouse, which are not illustrated in the drawing, may also be connected to the device connection interface 105. In this case, the device connection interface 105 transmits signals sent from the keyboard and the mouse to the processor 102. Note that the mouse is an example of a pointing device, and other pointing devices may be used. Other pointing devices include a touch panel, a tablet, a touch pad, a track ball, and the like.

An optical drive device, which is not illustrated in the drawing, may also be connected to the device connection interface 105. The optical drive device reads data recorded on an optical disk by utilizing laser or the like. An optical disk is a portable recording medium on which data is recorded so as to be readable using reflection of light. Optical disks include a digital versatile disc (DVD), a DVD-RAM, a compact disc read-only memory (CD-ROM), a CD-recordable (R)/rewritable (RW), and the like.

The disk interface 106 transmits and receives data to and from one or two or more SSDs 20. For example, the disk interface 106 includes an I/O controller and an expander.

With a hardware configuration as described above, the processing functions of the CM 100 of the second embodiment may be implemented. Note that the host 11 and the storage control device 1 illustrated in the first embodiment may be implemented by hardware such as that of the CM 100 illustrated in FIG. 4.

The CM 100 implements the processing functions of the second embodiment, for example, by running programs stored on a computer-readable recording medium. Programs in which processing content to be run by the CM 100 may be recorded on various recording media. For example, programs to be run by the CM 100 may be stored on the HDD 104. The processor 102 loads at least some of the programs stored on the HDD 104 to the RAM 103 and runs the loaded programs. Programs to be run by the CM 100 may also be recorded on portable recording media such as an optical disk, a memory device, and a memory card. The programs stored on a portable recording medium become executable after being installed onto the HDD 104 under control, for example, of the processor 102. Additionally, the processor 102 may directly read a program from a portable recording medium and run the program.

Figure 5:
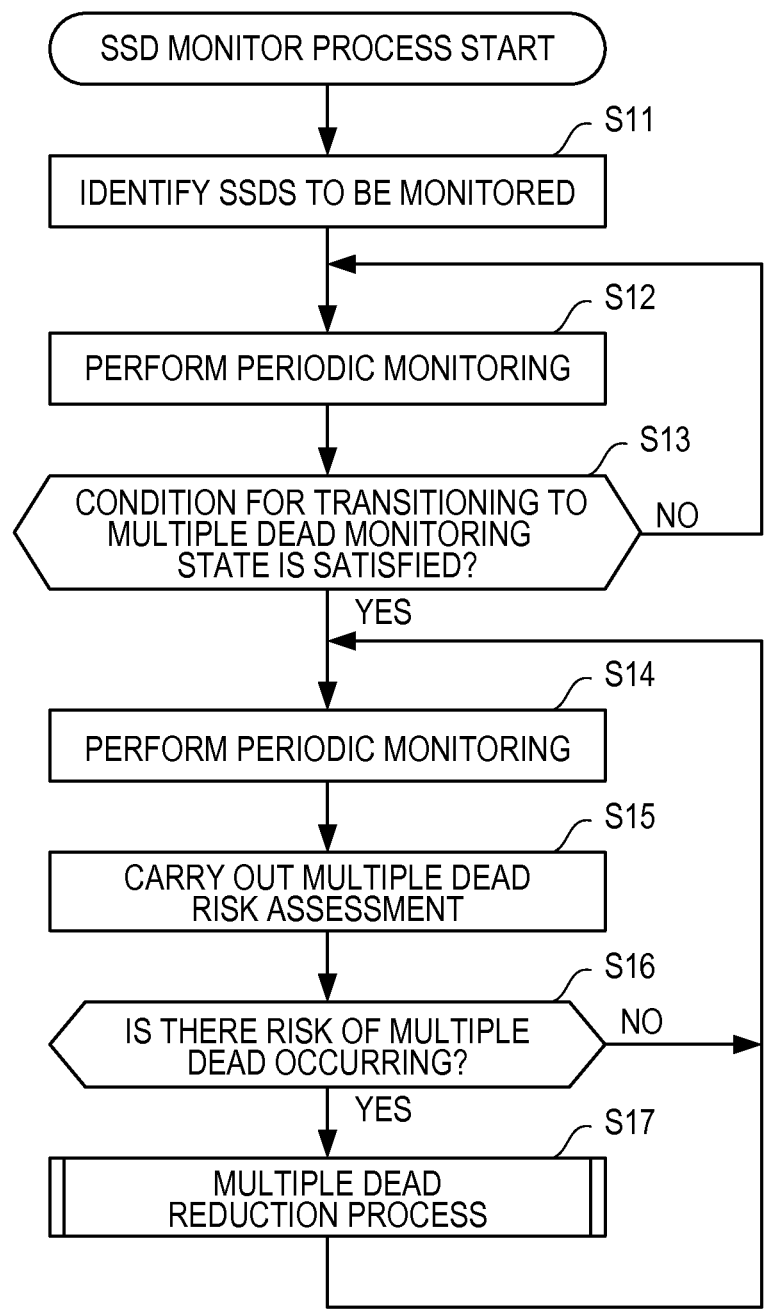
FIG. 5 is a flowchart of the SSD monitor process of the second embodiment.

Next, an SSD monitor process of the second embodiment will be described using FIG. 5. FIG. 5 is a flowchart of the SSD monitor process of the second embodiment.

The SSD monitor process is a process in which the possibility that multiple dead will occur is assessed for the SSDs 20 included in the RAID and the risk of multiple dead occurring is reduced. The SSD monitor process is a process executed by the CM 100 after startup of the CM 100. The CM 100 executes the SSD monitor process for each RAID group.

[Step S11] The CM 100 identifies SSDs 20 to be monitored. The CM 100 identifies two or more SSDs 20 included in a RAID group as the SSDs 20 to be monitored. For example, in the case where the SSDs 20a and 20b are included in the RAID 1, the CM 100 identifies the SSDs 20a and 20b as SSDs 20 to be monitored.

[Step S12] The CM 100 acquires information for measuring the degree to which every SSD 20 to be monitored is worn (hereinafter referred to as "wear-level measurement information" corresponding to a wear-state in the first embodiment), for example, for every SSD 20 to be monitored, by performing periodic monitoring intended for the SSDs 20 to be monitored. The CM 100 may acquire information that each SSD 20 stores as metadata in the internal memory thereof as wear-level measurement information by using the self-monitoring analysis and reporting technology (S.M.A.R.T.) of the SSD 20. Examples of the wear-level measurement information include the number of defective blocks (G-List), the write amount (the cumulative number of writes), the index value for rewrite cycles, the ratio of a user area to a spare area, and the like of the SSD 20.

Using wear-level measurement information or information computed based on wear-level measurement information, the CM 100 may detect the degree to which every SSD 20 is worn (hereinafter referred to as the "wear level" of the SSD 20). The CM 100 performs periodic monitoring at intervals set in advance. For example, the CM 100 carries out periodic monitoring every 10 minutes. The CM 100 records information acquired from each SSD 20 in a management table. The management table will be described below using FIG. 6.

[Step S13] The CM 100 determines whether or not the condition for transitioning to a multiple dead monitoring state is satisfied. The multiple dead monitoring state is a state in which the risk of multiple dead occurring in the SSD 20 to be monitored is monitored based on the result of periodic monitoring. The CM 100 determines whether or not the condition for transitioning to a multiple dead monitoring state is satisfied by comparing the wear level of the SSD 20 detected by periodic monitoring using a threshold set in advance (state transition threshold). When the wear levels of any one or more among the SSDs 20 to be monitored exceed the state transition threshold, the CM 100 determines that the condition for transitioning to a multiple dead monitoring state is satisfied.

For example, in the case where the write amount of the SSD 20 is used as the wear level, when the write amount of any SSD 20 exceeds a state transition threshold of "100000", the CM 100 determines that the condition for transitioning to a multiple dead monitoring state is satisfied. In the case where the write amount of the SSD 20 is used as the wear level, when the total write amount of all the SSDs 20 does not exceed a state transition threshold of "100000", for example, when the total write amount of all the SSDs 20 is "70000", the CM 100 determines that the condition for transitioning to a multiple dead monitoring state is not satisfied.

When the condition for transitioning to a multiple dead monitoring state is satisfied, the CM 100 proceeds to step S14. On the other hand, when the condition for transitioning to a multiple dead monitoring state is not satisfied, the CM 100 proceeds to step S12. That is, a monitor state where step S12 and step S13 form a loop is a normal monitoring state where the risk of multiple dead occurring is low.

[Step S14] The CM 100 acquires information for measurement of the wear level of every SSD 20 to be monitored by carrying out periodic monitoring of the SSD 20 to be monitored. Note that the periodic monitoring in step S14 may be carried out at a higher frequency than the periodic monitoring in step S12. For example, the CM 100 carries out periodic monitoring in step S14 once every five minutes. The CM 100 records information acquired from each SSD 20 to the management table.

[Step S15] The CM 100 carries out a multiple dead risk assessment according to information stored in the management table. The multiple dead risk assessment is an assessment of the risk that multiple dead will occur in two or more SSDs 20. For example, the CM 100 carries out a multiple dead risk assessment by determining whether or not the difference in wear level between the SSD 20 having the highest wear level and the SSD 20 having the next highest wear level exceeds a predetermined threshold (risk assessment threshold).

For example, when the difference in wear level between the SSD 20 having the highest wear level and the SSD 20 having the next highest wear level does not exceed a risk assessment threshold "10", the CM 100 determines that there is "a risk of multiple dead". When the difference in wear level between the SSD 20 having the highest wear level and the SSD 20 having the next highest wear level exceeds the risk assessment threshold "10", the CM 100 determines that there is "no risk of multiple dead".

[Step S16] The CM 100 determines whether or not the result of the multiple dead risk assessment is that there is a risk of multiple dead occurring. When the difference in wear level between the two SSDs 20 does not exceed the risk assessment threshold, the CM 100 determines that there is "a risk of multiple dead" and proceeds to step S17. On the other hand, when the difference in wear level between the two SSDs 20 exceeds the risk assessment threshold, the CM 100 determines that there is "no risk of multiple dead" and proceeds to step S14.

[Step S17] The CM 100 executes a multiple dead reduction process. The multiple dead reduction process is a process of reducing the risk of multiple dead occurring in the SSDs 20 in the RAID group. The multiple dead reduction process will be described below using FIG. 7. After execution of the multiple dead reduction process, the CM 100 proceeds to step S14. That is, a monitor state in which a loop from step S14 to step S16 or a loop from step S14 to step S17 is formed is a multiple dead monitoring state where the risk of multiple dead occurring is high.

In such a way, the RAID device 13 enlarges the difference between the SSD 20 having the highest wear level and the SSD 20 having the next highest wear level and thus may reduce the risk of multiple dead occurring in the SSDs 20 included in the RAID group.

Note that the CM 100 may carry out event trigger monitoring instead of periodic monitoring according to the number of write requests (for example, once every 100 times) accepted from the host 11. In this case, the CM 100 may carry out event trigger monitoring in step S14 at a higher frequency than event trigger monitoring in step S12. For example, the CM 100 carries out the event trigger monitoring in step S12 once every 100 times a write request is made, and carries out the event trigger monitoring in step S14 once every 20 times a write request is made.

Figure 6:
FIG. 6 is a diagram depicting an example of a management table of the second embodiment.

Next, the management table stored by the CM 100 will be described using FIG. 6. FIG. 6 is a diagram depicting an example of a management table of the second embodiment. The CM 100 stores, in the management table, information acquired from the SSDs 20 to be monitored by periodic monitoring. The information stored in the management table 200 is information collected from the SSDs 20 by the CM 100 by using the S.M.A.R.T. of the SSDs 20. The management table 200 is, for example, stored in the RAM 103.

The management table 200 includes an "SSD identification information" item, a "Number of defective blocks" item, and a "Write amount" item. The "SSD identification information" item represents information by which the SSD 20 to be monitored is identifiable. For example, in the case where, in the RAID device 13, the SSDs 20*a* and 20*b* are to be monitored, one piece of SSD identification information of the SSDs 20*a* and 20*b* is "#A", and the other piece thereof is "#B". The "Number of defective blocks" item represents the number of blocks in which memory cells (for example, NAND cells) of the SSD 20 are defective. For example, the number of defective blocks of the SSD 20 with the SSD identification information "#A" is "2", and the number of defective blocks of the SSD 20 with the SSD identification information "#B" is "4". The "write amount" item represents the cumulative number of writes to the SSD 20. For example, the write amount of the SSD 20 with the SSD identification information "#A" is "20000", and the write amount of the SSD 20 with the SSD identification information "#B" is "25000". Note that the management table 200 may include other items, for example, the index value for rewrite cycles, the ratio of a user area to a spare area, and the like.

Note that information stored in the management table 200 is updated by the CM 100 each time periodic monitoring is carried out. In addition, in the CM 100, a process for acquiring information by periodic monitoring may be shared by the processor 102 and the disk interface 106.

Figure 7:
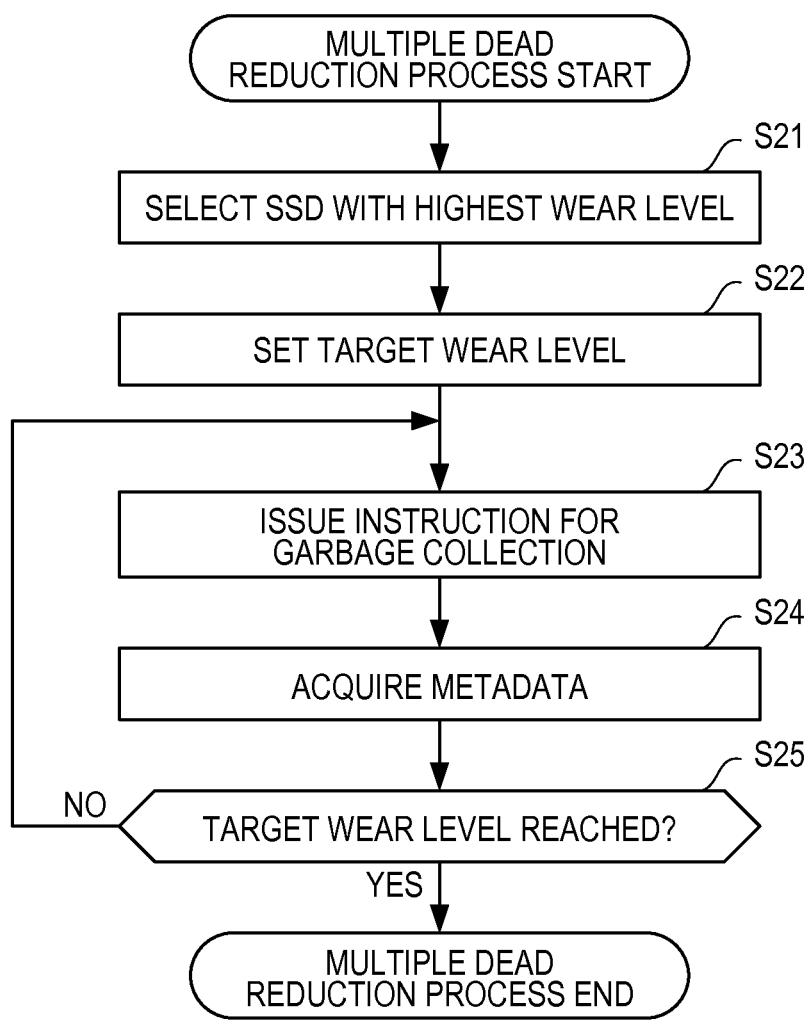
FIG. 7 is a flowchart of a multiple dead reduction process of the second embodiment.

Next, the multiple dead reduction process of the second embodiment will be described using FIG. 7. FIG. 7 is a flowchart of the multiple dead reduction process of the second embodiment.

The multiple dead reduction process is a process for reducing the risk of multiple dead occurring in the SSDs 20 in the RAID group. The multiple dead reduction process is a process executed by the CM 100 in step S17 of the SSD monitor process.

[Step S21] Referring to the management table, the CM 100 selects the SSD 20 having the highest wear level (hereinafter referred to as a "wear-level enlargement target SSD").

[Step S22] The CM 100 sets, for the wear-level enlargement target SSD, a target wear level for enlargement of the wear level of the wear-level enlargement target SSD. The CM 100 sets the target wear level so that there is a given difference between the target wear level and the wear level of the SSD 20 having the next highest wear level. For example, in the case where the number of defective blocks is used as an index of the wear level, the CM 100 sets the target number of defective blocks (target wear level) so that the difference between the target number of defective blocks and the number of defective blocks of the SSD 20 having the next largest number of defective blocks is "+10".

[Step S23] To take a measure for enlarging the wear level, the CM 100 instructs the wear-level enlargement target SSD to collect garbage. Note that the instruction for garbage collection is an example of the measure for enlargement of the wear level. For example, a positive erasing operation such as an instruction for performing trimming, performing writing and erasing of dummy data, and the like may be used.

[Step S24] The CM 100 acquires metadata from the wear-level enlargement target SSD.

[Step S25] The CM 100 determines, based on the acquired metadata, whether or not the wear-level enlargement target SSD has reached the target wear level. When the wear-level enlargement target SSD has not reached the target wear level, the CM 100 proceeds to step S23 and further enlarges the wear level of the wear-level enlargement target SSD. On the other hand, when the wear-level enlargement target SSD has reached the target wear level, the CM 100 completes the multiple dead reduction process.

In this way, the RAID device 13 enlarges the difference in wear level between the SSD 20 having the highest wear level and the SSD 20 having the next highest wear level, and thus may reduce the risk of multiple dead occurring in SSDs 20 included in the RAID group.

Third Embodiment

Figure 8:
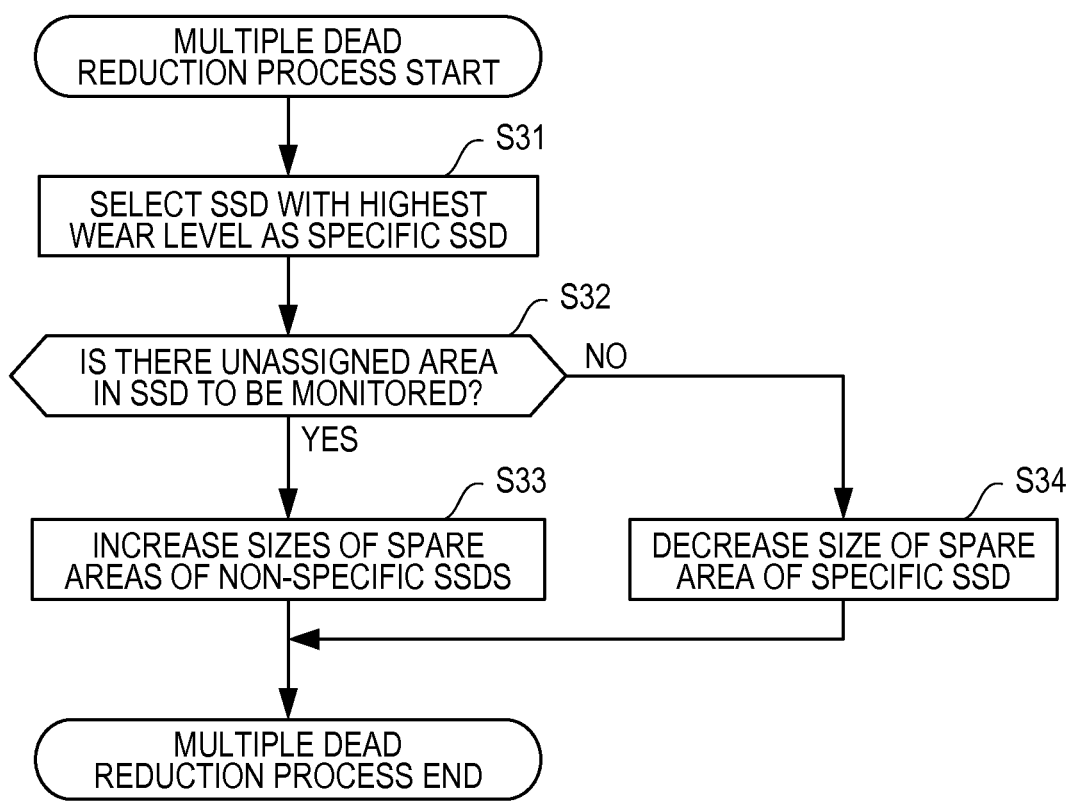
FIG. 8 is a flowchart of a multiple dead reduction process of a third embodiment.

Next, a multiple dead reduction process executed by a RAID device of a third embodiment will be described using FIG. 8. FIG. 8 is a flowchart of a multiple dead reduction process of the third embodiment. In contrast to the multiple dead reduction process of the second embodiment, wherein the wear level of the wear-level enlargement target SSD is positively enlarged, the multiple dead reduction process of the third embodiment differs in that the risk of multiple dead occurring is reduced by adjusting a spare area. Hereinafter, in the description on the third embodiment, configurations similar to those in the second embodiment are denoted by the same reference numerals and redundant description thereof is omitted.

The multiple dead reduction process is a process for reducing the risk of multiple dead occurring in the SSDs 20 in the RAID group. The multiple dead reduction process is a process executed by the CM 100 in step S17 of the SSD monitor process.

[Step S31] Referring to the management table, the CM 100 selects the SSD 20 having the highest wear level as a specific SSD.

[Step S32] The CM 100 determines whether or not there is an unassigned area in the SSD 20 to be monitored (monitor target SSD). When there is an unassigned area in the monitor target SSD, the CM 100 proceeds to step S33. When there is no unassigned area in the monitor target SSD, the CM 100 proceeds to step S34. Note that the CM 100 may determine, for the SSDs 20 (non-specific SSDs) remaining after excluding the specific SSD from the SSDs to be monitored, whether or not there is an unassigned area.

[Step S33] The CM 100 assigns part or the entirety of the unassigned area of the non-specific SSD to the spare area of the non-specific SSD and completes the multiple dead reduction process. Thus, the CM 100 enlarges the spare area of the non-specific SSD.

[Step S34] The CM 100 cancels the assignment of part or the entirety of the spare area of the specific SSD and completes the multiple dead reduction process. Thus, the CM 100 reduces the spare area of the specific SSD.

In this way, the RAID device 13 enlarges the difference in wear level between the SSD 20 having the highest wear level and the SSD 20 having the next highest wear level, and thus may reduce the risk of multiple dead occurring in SSDs 20 included in the RAID group.

Next, increase and decrease of a spare area in the multiple dead reduction process will be described using FIG. 9 to FIG. 16. Initially, the case where there is an unassigned area in the SSD to be monitored will be described using FIG. 9 to FIG. 12.

Figure 9:
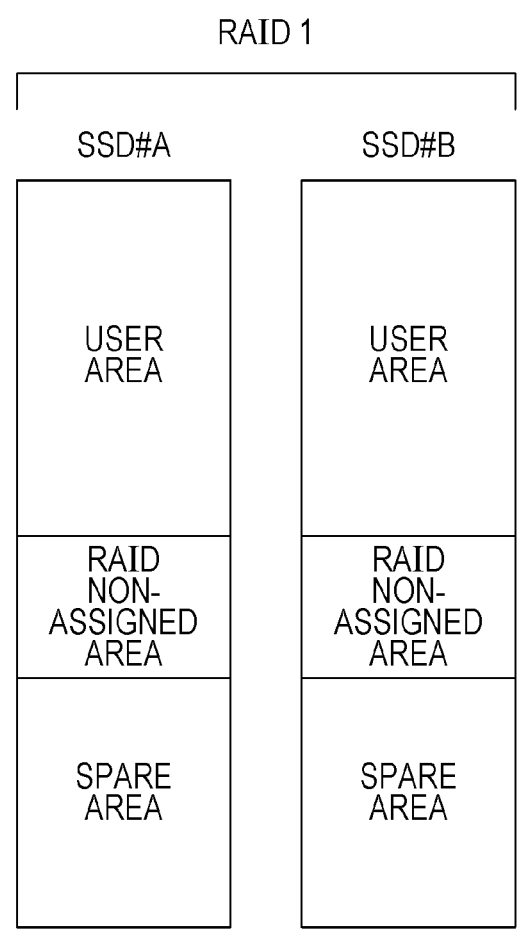
FIG. 9 is a diagram illustrating an example of area configurations in the early stage of area assignment of SSDs included in RAID of the third embodiment.

First, the area configuration in the early stage of area assignment of the SSDs 20 included in the RAID 1 will be described using FIG. 9. FIG. 9 is a diagram illustrating an example of area configurations in the early stage of area assignment of SSDs included in the RAID 1 of the third embodiment. Two SSDs 20 with the SSD identification information "#A" and the SSD identification information "#B" are included in the RAID 1. It is assumed below that one of the SSDs 20 is an SSD#A and the other thereof is an SSD#B. In the early stage of area assignment, the SSD#A and the SSD#B each have an equal user area, an equal RAID unassigned area, and an equal spare area in the area configuration.

Figure 10:
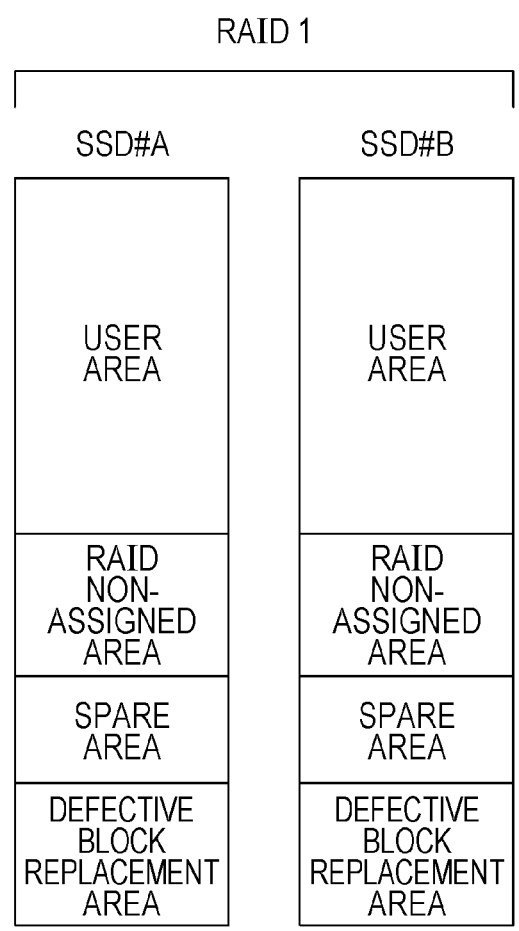
FIG. 10 is a diagram illustrating an example of area configurations after elapse of a given time period since the area assignment of the SSDs included in the RAID of the third embodiment.

Next, the SSDs 20 after elapse of a given time period since the area assignment will be described using FIG. 10. FIG. 10 is a diagram illustrating an example of area configurations after elapse of a given time period since the area assignment of the SSDs included in the RAID 1 of the third embodiment. In the SSD#A and the SSD#B, after elapse of the given time period since the area assignment, rewriting operations result in increased numbers of defective blocks. Defective blocks are replaced by spare areas to leave the sizes of user areas fixed. Note that since the SSD#A and the SSD#B are included in the RAID 1, the SSD#A and the SSD#B each have an equal increase in the number of defective blocks (an increase in wear level) caused by rewriting operations. Consequently, after elapse of the given time period since the area assignment, the SSD#A and the SSD#B each have an equal user area, an equal RAID unassigned area, an equal spare area, and an equal defective block replacement area in the area configuration.

Here, it is assumed that the RAID 1 including the SSD#A and the SSD#B has passed through the multiple dead monitoring state and is determined to be in a state where there is "a risk of multiple dead". At this point, since the SSD#A and the SSD#B have spare areas, the CM 100, in the multiple dead reduction process, enlarges the spare area of a non-specific SSD.

Figure 11:
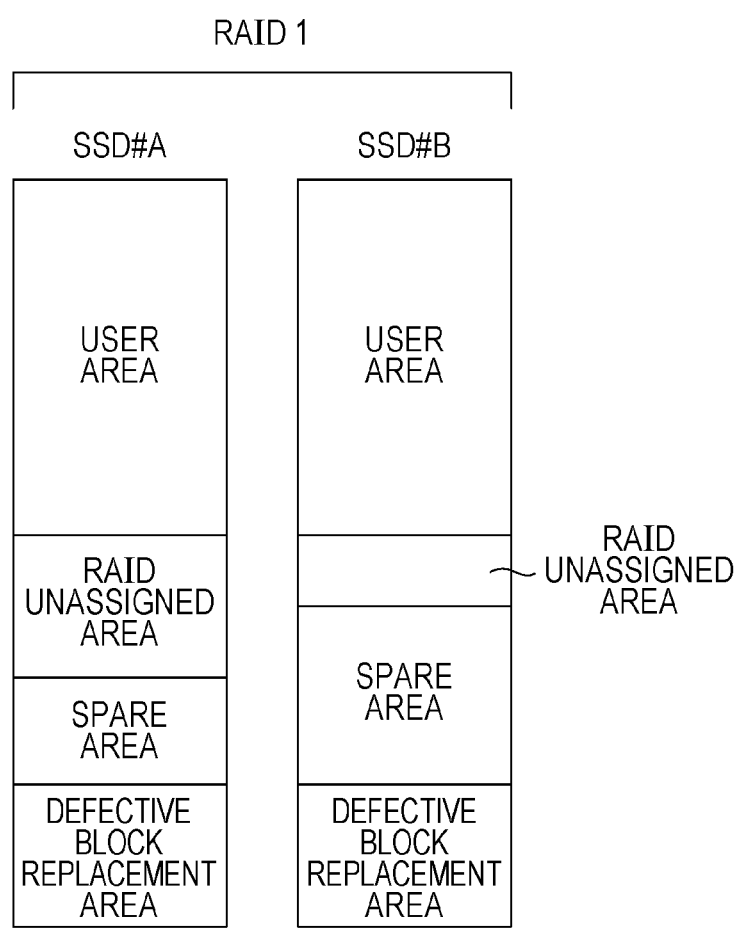
FIG. 11 is a diagram illustrating an example of area configurations after the multiple dead reduction process of SSDs included in the RAID of the third embodiment.

Next, the SSDs 20 at the time of enlargement of a spare area of a non-specific SSD will be described using FIG. 11. FIG. 11 is a diagram illustrating an example of area configurations after the multiple dead reduction process of SSDs included in the RAID 1 of the third embodiment. When the SSD#A is a specific SSD, and the SSD#B is a non-specific SSD, the CM 100 assigns part or the entirety of the RAID unassigned area to the spare area in the SSD#B. As a result, while the SSD#A and the SSD#B each have an equal user area and an equal defective block replacement area, the SSD#B has a larger spare area than the SSD#A. Enlargement of the spare area of the SSD#B, which is the non-specific SSD, enlarges the difference in wear level between the SSD#A and the SSD#B.

Figure 12:
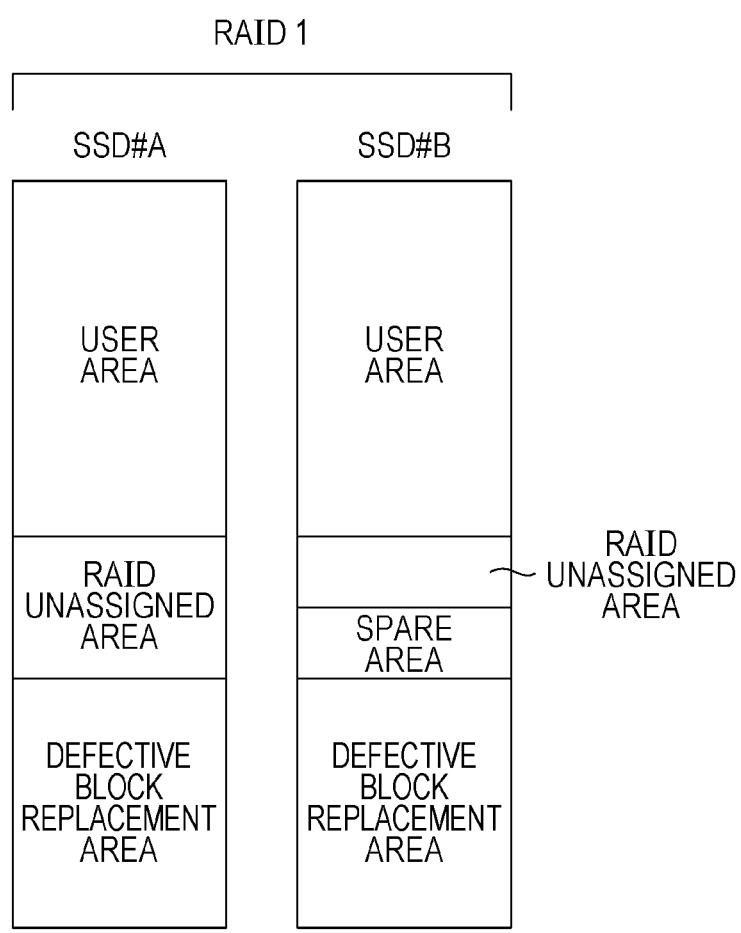
FIG. 12 is a diagram illustrating an example of area configurations at the time when a specific SSD included in the RAID of the third embodiment has reached its end of life.

Next, the SSDs 20 at the time when a specific SSD has reached its end of life will be described using FIG. 12. FIG. 12 is a diagram illustrating an example of area configurations at the time when a specific SSD included in the RAID 1 of the third embodiment has reached its end of life. Since the numbers of defective blocks of the SSD#A and the SSD#B are equally increased by rewriting operations after enlargement of the difference in wear level between the SSD#A and the SSD#B, the SSD#A, which is the specific SSD, reaches its end of life earlier than the SSD#B, which is the non-specific SSD. That is, the SSD#A, in which the spare area capable of being used for replacement has been exhausted earlier than that in the SSD#B, issues a failure prediction warning to the CM 100. The CM 100 determines that a wear value, representing the wear level, of the SSD#A reaches the first threshold, when the spare area of the SSD#A has been exhausted by an increase in the number of defective blocks.

In this way, the RAID device 13 reduces the risk of multiple dead occurring in which the SSD#A and the SSD#B reach their end of life at the same time. Additionally, the RAID device 13 does not lower the upper limits to the defective block replacement areas of the SSD#A and the SSD#B, and therefore achieves longer use of the SSDs 20 with a reduced risk of multiple dead occurring.

Note that, regarding an SSD for which assignment of a spare area cannot be controlled, the CM 100 may secure in advance a dummy area, as an unused user area, from the RAID unassigned area and release the dummy area at the time of enlargement of the spare area.

Figure 13:
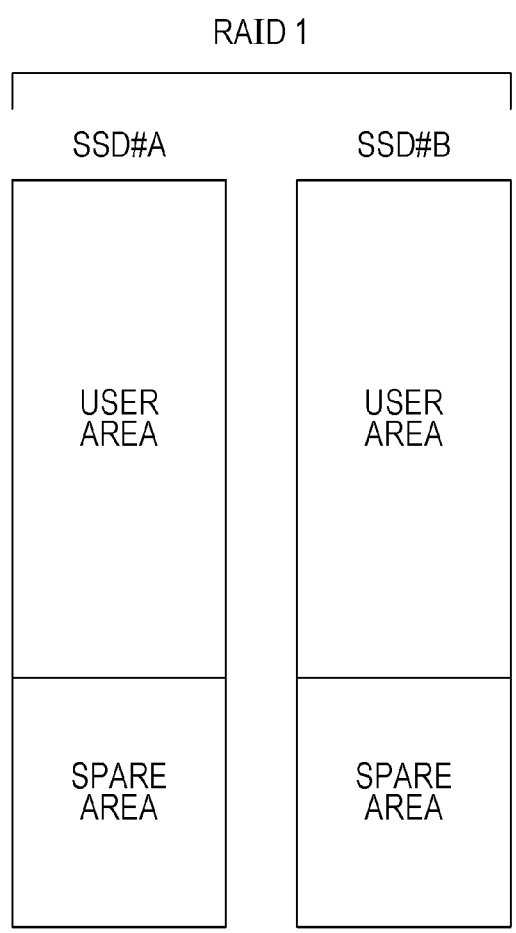
FIG. 13 is a diagram illustrating an example of area configurations in the early stage of area assignment of SSDs included in the RAID of the third embodiment.

Next, the case where there is no unassigned area in the SSDs to be monitored will be described using FIG. 13 to FIG. 16. First, the area configuration in the early stage of area assignment of the SSDs 20 included in the RAID 1 will be described using FIG. 13. FIG. 13 is a diagram illustrating an example of area configurations in the early stage of area assignment of SSDs included in the RAID 1 of the third embodiment. The SSD#A and the SSD#B are included in the RAID 1. In the early stage of area assignment, the SSD#A and the SSD#B each have an equal user area and an equal spare area in the area configuration.

Figure 14:
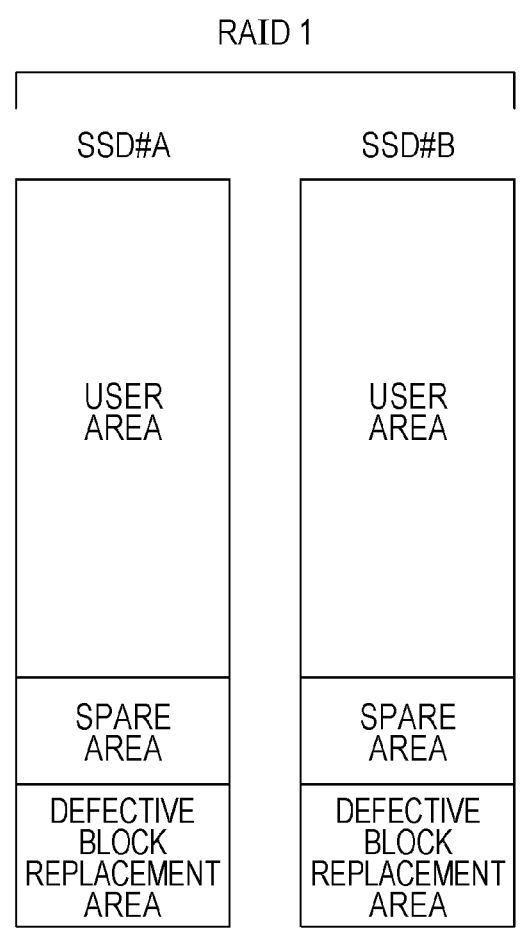
FIG. 14 is a diagram illustrating an example of area configurations after elapse of a given time period since the area assignment of the SSDs included in the RAID of the third embodiment.

Next, the SSDs 20 after elapse of a given time period since the area assignment will be described using FIG. 14. FIG. 14 is a diagram illustrating an example of area configurations after elapse of a given time period since the area assignment of the SSDs included in the RAID 1 of the third embodiment. In the SSD#A and the SSD#B, after elapse of the given time period since the area assignment, rewriting operations result in increased numbers of defective blocks. Defective blocks replace spare areas, leaving the sizes of user areas fixed. Note that since the SSD#A and the SSD#B are included in the RAID 1, the SSD#A and the SSD#B each have an equal increase in the number of defective blocks (an increase in wear level) caused by rewriting operations. Consequently, after elapse of the given time period since the area assignment, the SSD#A and the SSD#B each have an equal user area, an equal spare area, and an equal defective block replacement area in the area configuration.

Here, it is assumed that the RAID 1 including the SSD#A and the SSD#B has passed through the multiple dead monitoring state and is determined to be in a state where there is "a risk of multiple dead". At this point, since the SSD#A and the SSD#B have no unassigned areas, the CM 100, in the multiple dead reduction process, reduces the spare area of the specific SSD.

Figure 15:
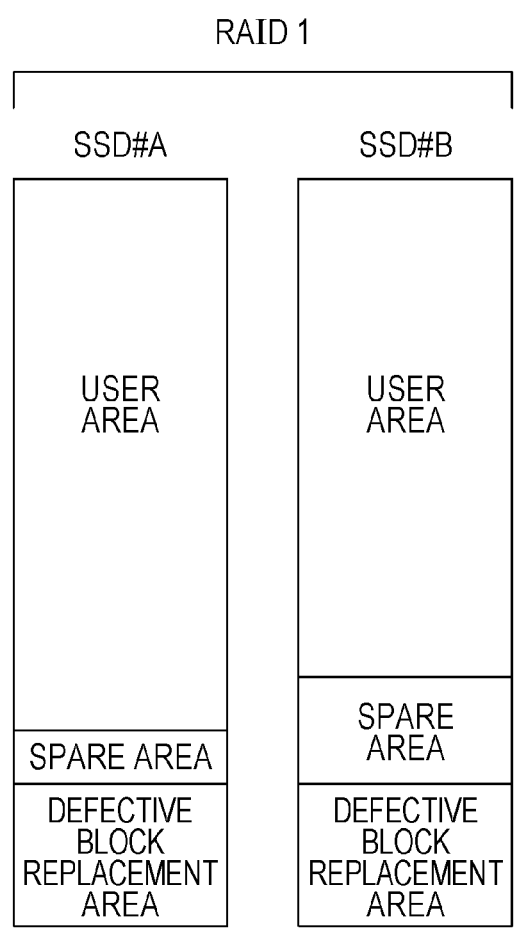
FIG. 15 is a diagram illustrating an example of area configurations after the multiple dead reduction process of SSDs included in the RAID of the third embodiment.

Next, the SSDs 20 at the time of reduction of a spare area of a specific SSD will be described using FIG. 15. FIG. 15 is a diagram illustrating an example of area configurations after the multiple dead reduction process in SSDs included in the RAID 1 of the third embodiment. When the SSD#A is a specific SSD, and the SSD#B is a non-specific SSD, the CM 100 assigns part or the entirety of the spare area to the user area in the SSD#A. As a result, while the SSD#A and the SSD#B each have an equal defective block replacement area, the SSD#B has a larger spare area than the SSD#A. Reduction of the spare area of the SSD#A, that is, the specific SSD enlarges the difference in wear level between the SSD#A and the SSD#B.

Figure 16:
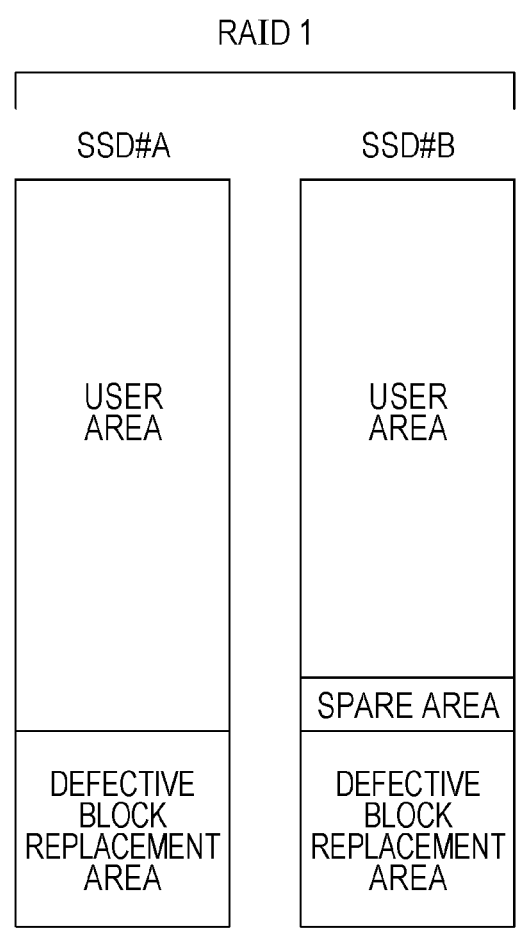
FIG. 16 is a diagram illustrating an example of area configurations at the time when a specific SSD included in the RAID of the third embodiment has reached its end of life.

Next, the SSDs 20 at the time when the specific SSD has reached its end of life will be described using FIG. 16. FIG. 16 is a diagram illustrating an example of area configurations at the time when the specific SSD included in the RAID 1 of the third embodiment has reached its end of life. Since the numbers of defective blocks of the SSD#A and the SSD#B are equally increased by rewriting operations after enlargement of the difference in wear level between the SSD#A and the SSD#B, the SSD#A, which is the specific SSD, reaches its end of life earlier than the SSD#B, which is the non-specific SSD. That is, the SSD#A, in which the spare area capable of being used for replacement has been exhausted earlier than that in the SSD#B, issues a failure prediction warning to the CM 100.

In this way, the RAID device 13 reduces the risk of multiple dead occurring in which the SSD#A and the SSD#B reach their end of life at the same time.

Note that, regarding an SSD for which assignment of a spare area is incapable of being controlled, the CM 100 may set a dummy area as an unused area at the time of reduction of the spare area.

Note that the processing functions described above may be implemented by a computer. In this case, there is provided a program describing processing content of functions to be provided in the storage control device 1 and the RAID device 13. The processing content described above is implemented on a computer by the program being executed by the computer. The program describing processing content may be recorded on a computer-readable recording medium. Examples of the computer-readable recording medium include a magnetic storage device, an optical disk, a magneto-optical recording medium, and a semiconductor memory. Examples of the magnetic storage device include a hard disk device (HDD), a flexible disk (FD), and a magnetic tape. Examples of the optical disk include a DVD, a DVD-RAM, and a CD-ROM/RW. Examples of the magneto-optical recording medium include a magneto-optical disk (MO).

When a program is put into circulation, portable recording media such as a DVD and a CD-ROM on which that program is recorded are sold, for example. In addition, a program may be stored in a storage device such as a server computer and be transferred via a network, from the server computer to another computer.

A computer that executes a program stores, in a storage device thereof, for example, a program recorded on a portable recording medium or a program transferred from a server computer. Then, the computer reads the program from the storage device thereof and executes a process according to the program. Note that the computer may directly read a program from a portable recording medium and execute a process according to the program. In addition, each time a program is transferred from a server computer connected via a network, the computer may execute a process according to the received program.

In addition, at least some of the processing functions described above may be implemented by an electronic circuit such as a DSP, an ASIC, or a PLD.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A storage control device that controls a plurality of solid state drives including a first solid state drive, the storage control device comprising:
   a detector that detects a wear state of each of the plurality of solid state drives;
   a separation controller that separates a solid state drive of the plurality of solid state drives having a wear value, which represents a wear state, exceeding a first threshold; and
   an enlargement controller that, when the wear value of the first solid state drive exceeds a second threshold less than the first threshold, enlarges a difference in the wear value between the first solid state drive and another of the plurality of solid state drives by reducing a spare area of the first solid state drive, the spare area being used for replacing a defective block, wherein
   the enlargement controller determines that the wear value of the first solid state drive reaches the first threshold, when the reduced spare area of the first solid state drive has been exhausted by an increase in a number of defective blocks.

2. The storage control device according to claim 1, wherein when the difference is smaller than a given threshold, the enlargement controller enlarges the difference.

3. The storage control device according to claim 2, wherein the enlargement controller enlarges the wear value of the first solid state drive having the wear value exceeding the second threshold.

4. The storage control device according to claim 3, wherein the enlargement controller causes the first solid state drive having the wear value exceeding the second threshold to perform a garbage collection.

5. The storage control device according to claim 2, wherein the enlargement controller enlarges a spare area of the other of the solid state drives.

6. A storage control method for controlling a plurality of solid state drives including a first solid state drive, the storage control method comprising:
   detecting, by a processor, a wear state of each of the plurality of solid state drives;
   separating, by the processor, a solid state drive of the plurality of solid state drives having a wear value, which represents a wear state, exceeding a first threshold; and
   when the wear value of the first solid state drive exceeds a second threshold less than the first threshold, enlarging, by the processor, a difference in the wear value between the first solid state drive and another of the plurality of solid state drives by reducing a spare area of the first solid state drive, the spare area being used for replacing a defective block, and
   determining, by the processor, that that the wear value of the first solid state drive reaches the first threshold, when the reduced spare area of the first solid state drive has been exhausted by an increase in a number of defective blocks.

7. A storage control device that controls a plurality of solid state drives including a first solid state drive, the storage control device comprising:
   a memory; and
   a processor coupled to the memory and configured to
   detect a wear value representing a wear state of each of the plurality of solid state drives,
   when the wear value of the first solid state drive exceeds a second threshold less than a first threshold, enlarge a difference in the wear value between the first solid state drive and another of the plurality of solid state drives by reducing a spare area of the first solid state drive, the spare area being used for replacing a defective block,
   determine that the wear value of the first solid state drive reaches the first threshold, when the reduced spare area of the first solid state drive has been exhausted by an increase in a number of defective blocks, and
   separate the first solid state drive.

* * * * *